(12) United States Patent
Zhang et al.

(10) Patent No.: US 6,411,634 B1
(45) Date of Patent: Jun. 25, 2002

(54) COST-EFFECTIVE HIGH PRECISION WAVELENGTH LOCKER

(75) Inventors: Qin Zhang; Wen hui Wang; Gang Hou, all of San Jose, CA (US)

(73) Assignee: Oplink Communications, Inc., San Jose, CA (US)

( * ) Notice: Subject to any disclaimer, the term of this patent is extended or adjusted under 35 U.S.C. 154(b) by 0 days.

(21) Appl. No.: 09/189,924

(22) Filed: Nov. 12, 1998

(51) Int. Cl.[7] .............................. H01S 3/13; G02B 27/14
(52) U.S. Cl. .............................. 372/32; 372/18; 372/20; 354/233; 354/234; 354/236; 354/341
(58) Field of Search ................................. 359/233, 234, 359/236, 341; 372/32, 18, 20

(56) References Cited

U.S. PATENT DOCUMENTS

| | | | | |
|---|---|---|---|---|
| 3,582,815 A | * | 6/1971 | Siebert et al. | 372/19 |
| 5,436,760 A | * | 7/1995 | Nakabayashi | 359/341 |
| 5,481,394 A | * | 1/1996 | Kimura | 359/234 |
| 5,777,763 A | | 7/1998 | Tomlinson, III | 359/130 |
| 5,798,859 A | * | 8/1998 | Colbourne et al. | 359/247 |
| 6,081,320 A | * | 6/2000 | Tanitsu | 355/71 |
| 6,108,355 A | * | 8/2000 | Zorabedian | 372/20 |

* cited by examiner

*Primary Examiner*—Paul Ip
*Assistant Examiner*—Cornelius H. Jackson
(74) *Attorney, Agent, or Firm*—Sawyer Law Group LLP

(57) ABSTRACT

A system and method for providing a wavelength locker is disclosed. In one aspect, the method and system include providing a reflector, a first filter, and a second filter. The reflector is for receiving an optical signal, transmitting a first portion of the optical signal, and reflecting a second portion of the optical signal. The first filter is for receiving the first portion and transmitting a third portion of the optical signal. The first filter includes a first axis and is capable of being tuned by rotation around the first axis to transmit the third portion including a particular wavelength. The second filter is for receiving the third portion and transmitting a fourth portion of the optical signal. The second filter includes a second axis substantially perpendicular to the first axis and is capable of being tuned by rotation around the second axis to transmit the fourth portion including the particular wavelength. In one aspect, the method and system also include photodetectors to receive the second and fourth portions of the optical signal. The photodetectors can measure a change in the wavelength of the optical signal from the particular wavelength using intensities of the second and fourth portions of the optical signal. Because first and second filters are used, polarization dependent loss is reduced and accuracy improved. The method and system also use a reduced number of components, are cost effective, and highly reliable.

18 Claims, 3 Drawing Sheets

COST-EFFECTIVE HIGH PRECISION WAVELENGTH LOCKER

FIELD OF THE INVENTION

The present invention relates to optical technology and more particularly to a method and system for providing a wavelength locker which is cost effective and capable of very precisely locking a wavelength of an optical signal to within particular limits.

BACKGROUND OF THE INVENTION

A variety of optical technology, such as communication via optical fibers, utilizes optical signals of a particular wavelength or wavelengths. Wavelength lockers ensure that an optical signal has a particular wavelength, $\lambda_C$, to within particular limits. Conventional wavelength lockers translate a change in wavelength to a change in intensity using a variety of configurations and components.

One conventional wavelength locker utilizes a pair of Fabry Perot ("FP") etalon filters. A reference optical signal from a light source desired to be locked in to the wavelength $\lambda_C$ is provided to a partial reflector. The partial reflector reflects a first portion of the optical signal and transmits a second portion of the optical signal. The first and second portions of the optical signal are provided to the first and second FP etalon filters, respectively. The response of each FP etalon filter changes with wavelength. When the wavelength of the optical signal is $\lambda_C$, the FP etalon filters transmit the same intensity. When the wavelength of the optical signal drifts from $\lambda_C$, the FP etalon filters transmit different intensities. Photodetectors receive light transmitted by the FP etalon filters. The difference in intensities when the optical signals drift from $\lambda_C$ is used to lock the light source to wavelengths within a particular range of $\lambda_C$.

Another conventional wavelength locker also uses an etalon filter. A reference optical signal from a light source is provided to the filter. The filter reflects a portion of the optical signal and transmits a portion of the optical signal. The transmission and reflection responses of the etalon filter change in opposite directions with the wavelength of the optical signal provided to the filter. When the wavelength of the optical signal is $\lambda_C$, the reflected and transmitted intensities are the same. When the wavelength of the optical signal drifts from $\lambda_C$, the reflected and transmitted intensities differ. Photodetectors receive the transmitted and reflected portions of the optical signal. The difference in intensities when the optical signal drifts from the desired wavelength $\lambda_C$ is used to control the light source to produce light having wavelength $\lambda_C$ within the particular limits. Yet another conventional wavelength locker is based on a holographic grating.

Although the conventional wavelength lockers function, one of ordinary skill in the art will realize that the FP etalon filters used in some of the conventional wavelength lockers are expensive and difficult to manufacture. The holographic grating technology is both temperature sensitive and very expensive. Methods have been published to replace etalon or holographic grating with dielectric thin film interference filters. However, the filters may also induce losses in transmitted light that depend on polarization. These polarization dependent losses may adversely affect the conventional wavelength locker's ability to accurately determine wavelength and, therefore, lock in on the particular wavelength.

Accordingly, what is needed is a system and method for providing a cost-effective, high precision wavelength locker, for example a wavelength locker that is suitable for dense wavelength division multiplexer applications. The wavelength locker produced should also be reliable and stable over a range of temperatures. The present invention addresses such a need.

SUMMARY OF THE INVENTION

The present invention provides a method and system for stabilizing a wavelength of an optical signal to within a particular range, otherwise known as locking the wavelength. In one aspect, the method and system comprise providing a partial reflector, a first filter, and a second filter. The partial reflector is for receiving an optical signal, transmitting a first portion of the optical signal, and reflecting a second portion of the optical signal. The first filter is for receiving the first portion and transmitting a third portion of the optical signal. The first filter includes a first axis and is capable of being tuned by rotation around the first axis to transmit the third portion including a particular wavelength. The second filter is for receiving the third portion and transmitting a fourth portion of the optical signal. The second filter includes a second axis substantially perpendicular to the first axis and is capable of being tuned by rotation around the second axis to transmit the fourth portion including the particular wavelength. In this aspect, the first filter may have a first transmission spectrum and the second filter may have, a second transmission spectrum substantially similar to the first transmission spectrum. The particular wavelength may be located at first and second points on the first and second transmission spectra, respectively, to maximize a range in which the particular wavelength can be provided and reduce polarization dependent loss. In another aspect, the method and system comprise separating an input signal into first and second portions and filtering the first portion to provide a third portion of the input signal. The third portion has a first polarization dependence. The method and system also comprise filtering the third portion to provide a fourth portion of the input signal. Filtering the third portion includes compensating for the first polarization dependence. Thus, the fourth portion has a second polarization dependence that is less than the first polarization dependence.

According to the system and method disclosed herein, the present invention provides a wavelength locker which is relatively inexpensive and precise thereby increasing overall system performance.

DETAILED DESCRIPTION OF THE INVENTION

The present invention relates to an improvement in optical technology. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

The present invention provides for a method and system for providing a wavelength locker. In one aspect, the method and system comprise providing a partial reflector, a first filter, and a second filter. The partial reflector is for receiving an optical signal, transmitting a first portion of the optical signal, and reflecting a second portion of the optical signal. The first filter is for receiving the first portion and transmitting a third portion of the optical signal. The first filter includes a first axis and is capable of being tuned by rotation around the first axis to transmit the third portion including a particular wavelength. The second filter is for receiving the third portion and transmitting a fourth portion of the optical signal. The second filter includes a second axis substantially perpendicular to the first axis and is capable of being tuned by rotation around the second axis to transmit the fourth portion including the particular wavelength. In another aspect, the method and system comprise separating an input signal into first and second portions and filtering the first portion to provide a third portion of the input signal. The third portion has a first polarization dependence. The method and system also comprise filtering the third portion to provide a fourth portion of the input signal. Filtering the third portion includes compensating for the first polarization dependence. Thus, the fourth portion has second polarization dependence that is less than the first polarization dependence.

The present invention will be described in terms of a wavelength locker having a particular configuration. However, one of ordinary skill in the art will readily recognize that this method and system will operate effectively for other configurations. In addition, the present invention will be described in the context of a single wavelength, $\lambda_C$. However, one of ordinary skill in the art will recognize that the optical signals contain a range of wavelengths which is desired to include the wavelength $\lambda_C$. In a preferred embodiment, the range of wavelengths around $\lambda_C$ is relatively small.

Figure 1:
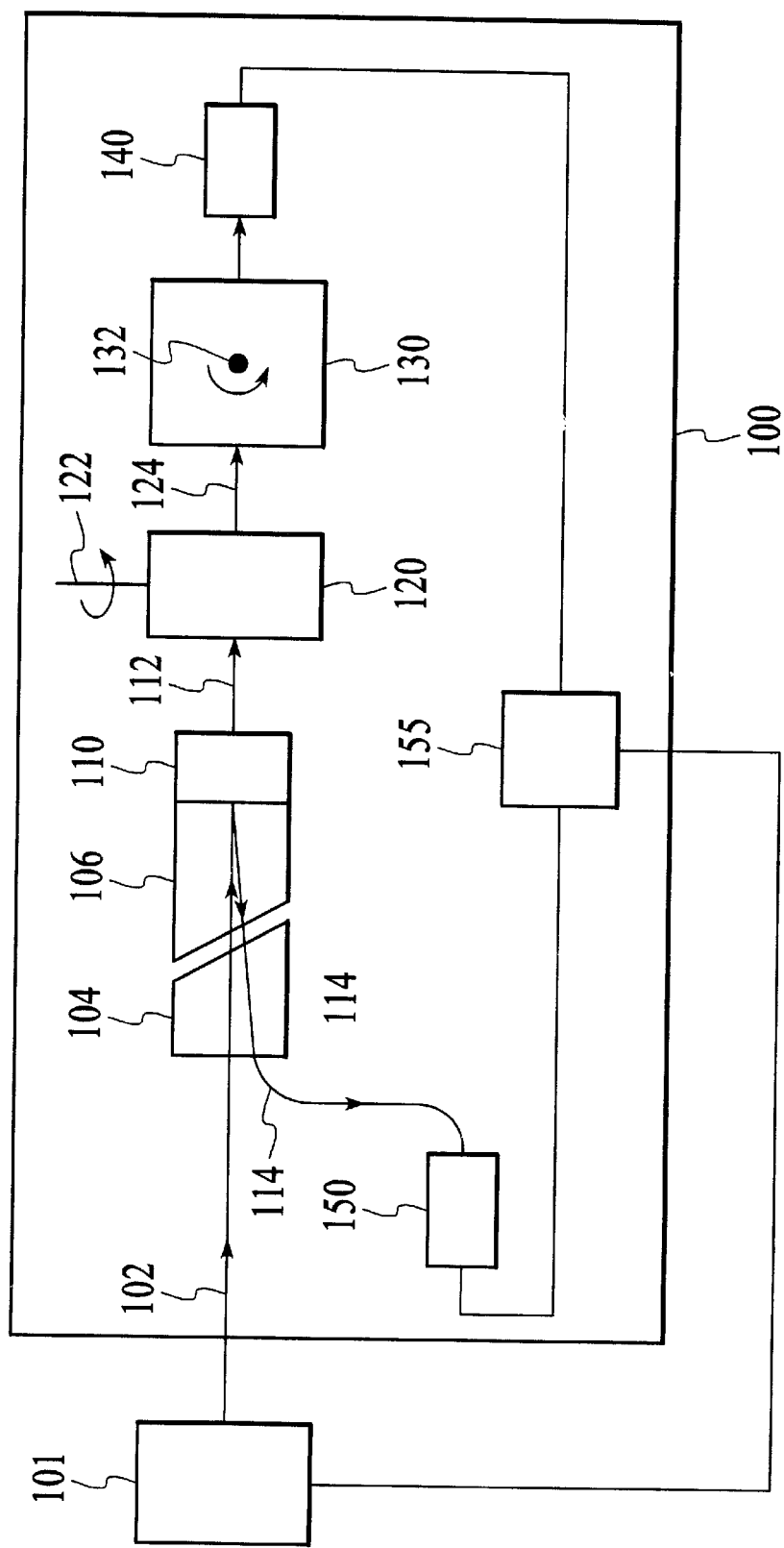
FIG. 1 is a block diagram of a wavelength locker in accordance with the present invention.

To more particularly illustrate the method and system in accordance with the present invention, refer now to FIG. 1 depicting a block diagram of one embodiment of a system including a wavelength locker 100 in accordance with the present invention. The system also includes a light source 101 which is preferably a laser. The laser 101 provides a reference optical signal 102 to the wavelength locker 100 via a fiber. The wavelength locker 100 includes an optical coupler 104 holding two fibers, a graduated index of refraction (GRIN) lens 106, a partial reflector 110, a first filter 120, a second filter 130, photodiodes 140 and 150, and circuitry 155. In a preferred embodiment, the partial reflector 110 transmits approximately two thirds of the optical signal 102 and reflects approximately one-third of the optical signal 102. However, nothing prevents different fractions of the optical signal 102 being transmitted and reflected by the partial reflector. The first filter 120 and the second filter 130 each has an axis 122 and 132, respectively. The axis 122 is the axis around which the first filter 120 is rotated to tune the first filter 120 to the desired wavelength $\lambda_C$. The axis 132 is the axis around which the second filter 130 is rotated to tune the first filter 120 to the desired wavelength $\lambda_C$. The second axis 120 is substantially perpendicular to the first axis 122.

Filters 120 and 130 can be made of thin film interference filters. Thin film filters are very environmentally stable and reliable. For example, thin film filters are relatively temperature insensitive. No additional temperature control equipment is needed. Thin film filters can be designed with a variety of shapes to match the desired wavelengths and with particular transmission spectra. The shapes of the transmission spectra of thin film filters are discussed more fully below. Moreover, thin film filters have a relatively low cost. Consequently, the wavelength locker 100 in accordance with the present invention preferably utilizes thin film filters for the first filter 120 and the second filter 130. In a preferred embodiment, the shape of the transmission spectrum for the first filter 120 and the shape of the transmission spectrum for the second filter 130 are substantially the same. The shape can be designed such that the wavelength locker 100 is suitable for dense wavelength division multiplexer applications and utilizes filters which are low in cost and stable.

The optical signal 102 is provided to the partial reflector 110 through the optical coupler 104 and GRIN lens 106. Prior to being incident on the partial reflector 110, the optical signal 102 has a direction of propagation indicated by the arrow in the GRIN lens 106 pointing toward the partial reflector 110. The optical signal 102 is desired to have a particular wavelength, $\lambda_C$. The partial reflector 110 transmits a first portion 112 of the optical signal 102 and reflects a second portion 114 of the optical signal 102. The first portion 112 of the optical signal has a first propagation direction. The second portion 114 of the optical signal 102 has a second propagation direction. The second propagation direction is indicated by the arrow in the GRIN lens 106 pointing away from the partial reflector 110. The second propagation direction is preferably substantially opposite to the direction of propagation of the optical signal 102. The second portion 114 of the optical signal 102 is transmitted to the photodetector 150 through an optical fiber. The first portion 112 of the optical signal 102 is transmitted to the first filter 120. The first filter 120 transmits a third portion 124 of the optical signal 102. The third portion 124 of the optical signal 102 is provided to the second filter 130. The second filter 130 is tuned to transmit light having the desired wavelength $\lambda_C$. Thus, the second filter 130 transmits a fourth portion 134 of the optical signal 102.

Figure 2A:
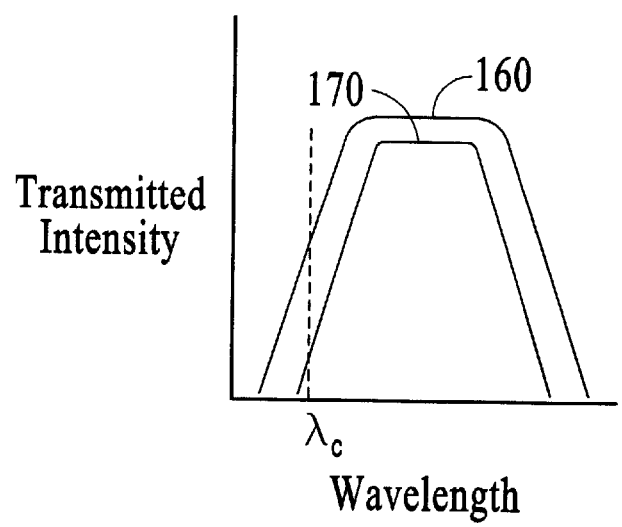
FIG. 2A depicts a transmission spectrum for the first filter in a wavelength locker in accordance with the present invention.
Figure 2B:
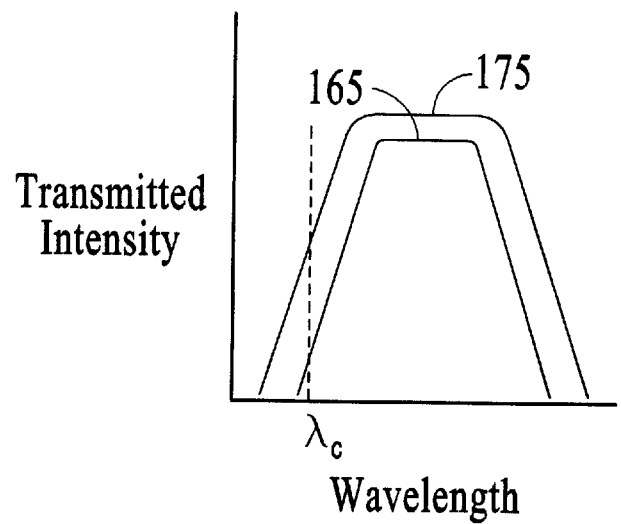
FIG. 2B depicts a transmission spectrum for the second filter in a wavelength locker in accordance with the present invention.

Referring now to FIGS. 2A and 2B, the transmission spectrum for the first filter 120 and the transmission spectrum the second filter 130, respectively, are shown. The first filter 120 and second filter 130 transmit light at a portion of the transmission spectra, known as the spectral slope. Because the spectral slope on the curves 160, 165, 170, and 175 is used to transmit light in a range around $\lambda_C$, the filters 120 and 130 can transmit a range of wavelengths. Consequently, the wavelength locker 100 can be used to lock in a relatively large range of wavelengths. The first filter 120 and second filter are also tuned to transmit light having a wavelength $\lambda_C$. Thus, the first filter 120 and second filter 130 are tuned to transmit light at a particular position on their spectral slopes. The first filter 120 and second filter 130 are depicted as tuned to transmit light in a range around $\lambda_C$, located on the leading edge of the transmission spectra depicted in FIGS. 2A and 2B, respectively. However, the first filter 120 and second filter 130 could also be tuned to transmit light in a range around a wavelength at the trailing edge of their transmission spectra.

Referring back to FIG. 1, the photodiode 140 detects the intensity, P1, of the fourth portion 134 of the optical signal 102. In general, P1 is given by $f(\lambda)*P0$, where $\lambda$ is the wavelength of the fourth portion 134 of the optical signal 102 and P0 is the intensity of the optical signal 102. In a preferred embodiment, losses from the first filter 120 and the second filter 130 reduce the intensity of the fourth portion 134 of the optical signal to be approximately half of the first portion 112 of the optical signal 102 when $\lambda$ equals $\lambda_C$. The photodiode 150 detects the intensity, P2, of the second portion 114 of the optical signal 102. In general, P2 is given by $\alpha*P0$, where a is the portion of the optical signal 102 reflected by the partial reflector 110. In a preferred embodiment, when $\lambda$ is $\lambda_C$, P2 is equal to P1.

Figure 3:
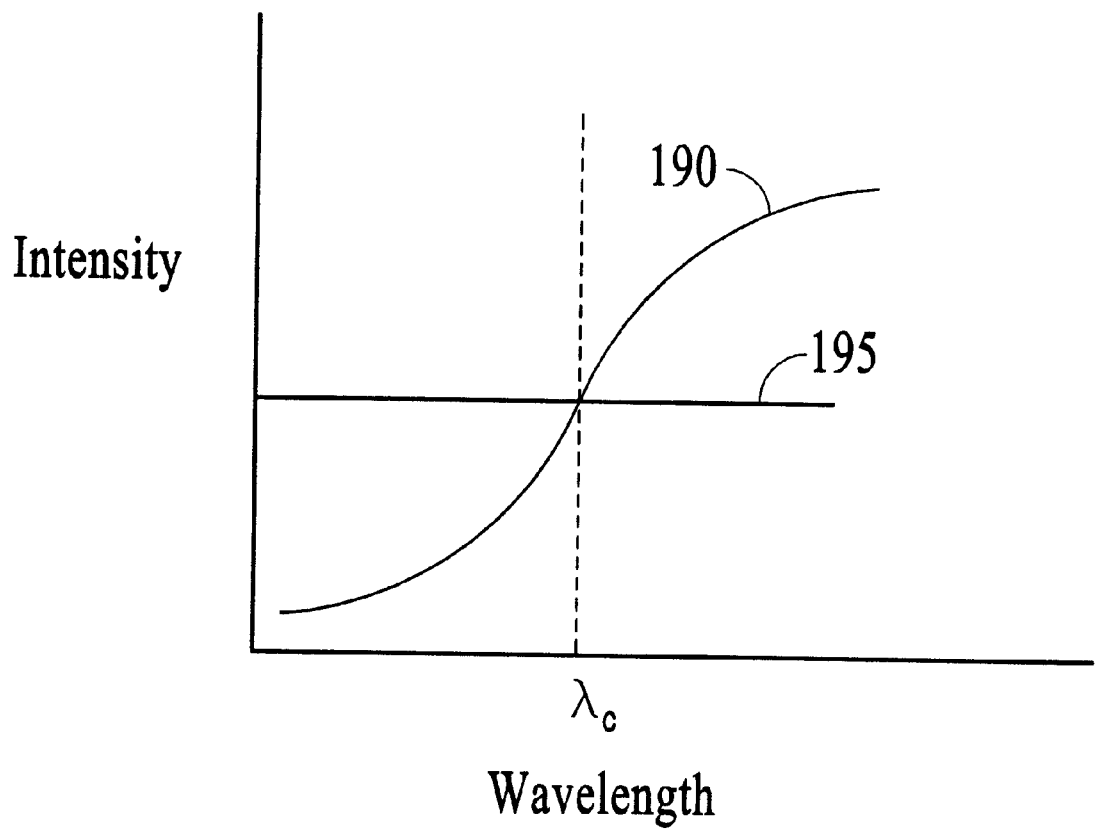
FIG. 3 depicts the optical signal intensities detected by the first and second photodiodes.

FIG. 3 depicts intensities P1 and P2 versus wavelength. The curve 190 depicts the P1 versus wavelength. The curve 195 depicts P2 versus wavelength. P1 190 and P2 195 are equal at the desired wavelength $\lambda_C$. However, where the wavelength has drifted from $\lambda_C$, P1 190 and P2 195 differ. Consequently, the wavelength locker 100 can determine the drift in wavelength from $\lambda_C$ and change the parameters of the laser 101 to lock the wavelength of light produced by the laser 101 to $\lambda_C$. In other words the wavelength locker 100 can lock the laser 101 to within a range of $\lambda_C$.

In order to lock the laser 101 to the wavelength $\lambda_C$, the circuitry 155 calculates a quantity corresponding to the error in the wavelength of the optical signal 102. In a preferred embodiment, this error is given by (P1–P2)/P2. This is equivalent to $(f(\lambda)-\alpha)/\alpha$. Therefore, fluctuations in the intensity of the optical signal 102 will not contribute to the error. When the error is zero, light of the desired wavelength $\lambda_C$ is being provided. When the error is less than zero, the wavelength of the optical signal 102 has drifted to a wavelength less than $\lambda_C$. When the error is greater than zero, the wavelength of the optical signal 102 has drifted to a wavelength greater than $\lambda_C$. The circuitry 155 can then alter the properties of a laser 101 to ensure that light having the desired wavelength is produced. Note that the first filter 120 and the second filter 130 can be tuned to transmit light on the trailing edge of the transmission spectra depicted in FIGS. 2A and 2B. In such a case, the error function will have the opposite sign.

Because the axis 122 of the first filter 120 is substantially perpendicular to the axis 132 of the second filter 130, the second filter may also compensate for PDL (polarization dependent losses) introduced by the first filter 120. The polarization of light can be decomposed into states, the S state and the P state. The S and P states can be defined with respect to the plane of incidence of the light. The plane of incidence for light includes the directions of propagation of light incident to and the light reflected from a particular element. The P state includes light having its electric field polarized parallel to the plane of incidence. The S state includes light having it electric field polarized perpendicular to the plane of incidence. The S and P states are mutually perpendicular. The S and P states are also perpendicular to the direction of propagation of the light. Typically, when encountering a tilted filter, such as the first filter 120 and the second filter 130, the S state is transmitted differently than the P state. Therefore, when tilted to tune to the desired wavelength, $\lambda_C$, each fitter 120 and 130 may introduce a polarization dependence into the light transmitted 124 and 134, respectively. However, by ensuring that the S state for the first filter 120 becomes the P state for the second filter 130, polarization dependent losses can be reduced. This is accomplished by configuring the first filter 120 and the second filter 130 such that the first axis 122 is perpendicular to the second axis 132.

Note, however, either the filter 120 or 130 might be manufactured to transmit the desired wavelength at the desired position on the spectral slope without angle tuning. Thus, the filter 120 or 130 can be placed with an extremely small angle of incidence and still transmit $\lambda_C$ at the desired position on the spectral slope. In other words, the filter 120 or 130 can be manufactured so that a face of the filter 120 or 130 can be placed substantially perpendicular to the direction of propagation of incident light and the filter 120 or 130 can transmit the desired wavelength at the desired position on the spectral slope. In such a case, polarization dependent losses would be reduced while using only a single filter 120 or 130.

To more clearly depict how the filters 120 and 130 reduce polarization dependent losses, refer to FIGS. 2A and 2B. FIG. 2A depicts the transmission spectrum of light for the first filter 120. The transmission spectrum of the first filter 120 for the P state is shown by the curve 160. The transmission spectrum of the first filter 120 for the S state is shown by the curve 170. The first filter 120 transmits the P state 160 more readily than the S state 170 at wavelength $\lambda_C$. FIG. 2B depicts the transmission spectrum for the second filter 130. The transmission spectrum for the P state is 165. The transmission spectrum for the S state is shown by curve 175. Thus, although the transmission spectrum first filter 120 and the second filter 130 are substantially the same, the second filter 130 transmits the S state more readily than in the P state at the wavelength $\lambda_C$. The S state 170 for the first filter 120 is the P state 165 for the second filter 130 because the second filter 130 is rotated along the axis perpendicular to that of the first filter 120. For the same reason, the P state 160 for the first filter 120 is the S state 175 for the second filter 130.

Figure 2C:
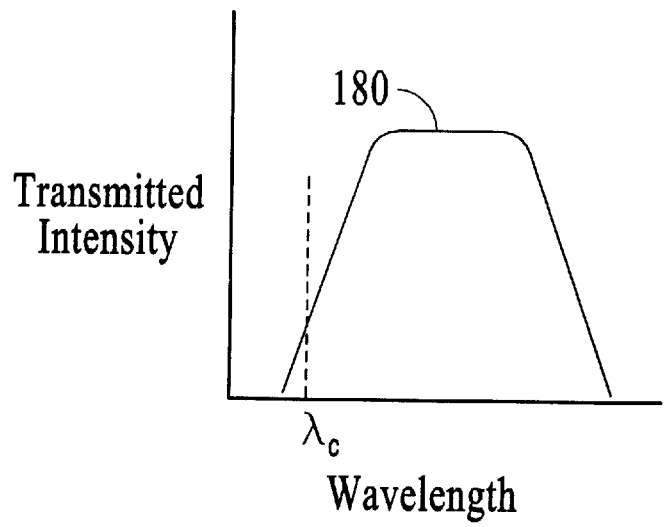
FIG. 2C depicts a transmission curve for the combination of the first and second filters in a wavelength locker in accordance with the present invention.

Because the axis 132 of the second filter 130 is perpendicular to the axis 122 of the first filter 120 and, the S and P states are reversed. Therefore, the S and P states are transmitted in the same manner by the combination of the first filter 120 and the second filter 130. In other words, polarization dependencies in transmission introduced by the first filter 120 are substantially compensated for by the second filter 130. This feature is exemplified in FIG. 2C, which depicts the transmission spectrum for the combination of the first filter 120 and the second filter 130. The transmission curves for the S and the P states have converged to a single curve 180 for the combination of the first filter 120 and second filter 130. Thus, the dependence of the wavelength locker 100 on the polarization of the incoming signal has been significantly reduced.

Because the polarization dependent losses are reduced, the measurement of the intensity P1 can more accurately reflect the drift in the wavelength of the optical signal 102 from the desired wavelength $\lambda_C$. Thus, the error in the wavelength can be more accurately calculated and compensated for using the circuitry 155. Thus, the wavelength locker 100 in accordance with the present invention is more accurate and can better maintain a stable wavelength $\lambda_C$ than a conventional wavelength locker. In addition, because of the number and type of components used, the cost of the wavelength locker 100 may be significantly reduced. In addition, because the spectral slope of the filters 120 and 130 are used, the wavelength locker 100 can lock the laser 101 into a relatively large range of wavelengths. Consequently, the wavelength locker 100 in accordance with the present invention is cost effective, stable, has a high precision, and can lock in a relatively large range of wavelengths.

For example, in one embodiment, the wavelength locker 100 can lock the wavelength of light produced by the laser 101 to within 0.02 nm and has a locking range of 0.5 nm. Because thin film interference filters may be used for filters 120 and 130, the wavelength locker 100 is also relatively low in cost and has good temperature stability. In one embodiment, the temperature stability of the wavelength locker 100 is on the order of 0.3 pm/degree Centigrade. The polarization dependence of such an embodiment is less than or equal to approximately plus or minus 0.01 nm. It is noted that conventional commercially available wavelength lockers may have a locking range on the order of 0.3 nm or less, and have a temperature stability of up to 1 pm/degree Centigrade. Consequently, the wavelength locker 100 may have high accuracy, stability, and reliability at a relatively low cost.

A method and system has been disclosed for providing a wavelength locker. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A wavelength locker comprising:
    a partial reflector for receiving an optical signal, for transmitting a first portion of the optical signal, and for reflecting a second portion of the optical signal;
    a first filter for receiving the first portion of the optical signal from the partial reflector and transmitting a third portion of the optical signal, the first filter including a first axis, the first filter capable of being tuned by rotation around the first axis to transmit the third portion of the optical signal including a particular wavelength;
    a second filter for receiving the third portion of the optical signal and transmitting a fourth portion of the optical signal, the second filter further including a second axis substantially perpendicular to the first axis, the second filter capable of being tuned by rotation around the second axis to transmit the fourth portion of the optical signal including the particular wavelength; and
    means for comparing the second portion of the optical signal to the fourth portion of the optical signal.

2. The wavelength locker of claim 1 wherein the first filter has a first transmission spectrum having a first spectral slope, the second filter has a transmission spectrum having a second spectral slope, wherein the first filter transmits the third portion of the optical signal substantially at a first position on the first spectral slope and the second filter transmits the fourth portion of the optical signal at a second position of the second spectral slope, the first position and the second position being substantially at the particular wavelength.

3. The wavelength locker of claim 1 wherein the third portion of the optical signal further includes a first, polarization dependent loss and the fourth portion of the optical signal has a second polarization dependent loss, the second polarization dependent loss significantly less than the first polarization dependent loss.

4. The wavelength locker of claim 1 wherein the optical signal further includes a direction of propagation;
    the first filter being disposed at a first angle from perpendicular to the direction of propagation, the first angle further comprising a rotation around the first axis of a first amount; and
    the second filter being disposed at a second angle from perpendicular to the direction of propagation, the second angle further comprising a rotation around the second axis of a second particular amount, the second particular amount being substantially the same as the first particular amount.

5. The wavelength locker of claim 1 wherein the comparing means further include:
    a first photodiode receiving the fourth portion of the optical signal; and
    a second photodiode receiving the second portion of the optical signal.

6. The wavelength locker of claim 5 wherein the optical signal has first intensity, the fourth portion of the optical signal has a second intensity, the second portion of the optical signal has a third intensity, and wherein the comparing means further include:
    means for detecting a drift in the fourth portion of the optical signal from the particular wavelength, the drift being detected by subtracting the third intensity from the second intensity to provide a subtracted intensity and dividing the subtracted intensity by the third intensity.

7. A method for providing a wavelength locker comprising the steps of:
    (a) providing a partial reflector for receiving an optical signal, for transmitting a first portion of the optical signal, and for reflecting a second portion of the optical signal;
    (b) providing a first filter for receiving the first portion of the optical signal from the partial reflector and transmitting a third portion of the optical signal, the first filter including a first axis, the first filter capable of being tuned by rotation around the first axis to transmit the third portion of the optical signal including a particular wavelength;
    (c) providing a second filter for receiving the third portion of the optical signal and transmitting a fourth portion of the optical signal, the second filter further including a second axis substantially perpendicular to the first axis, the second filter capable of being tuned by rotation around the second axis to transmit the fourth portion of the optical signal including the particular wavelength; and
    (d) providing means for comparing the second portion of the optical signal to the fourth portion of the optical signal.

8. The method claim 7 wherein the first filter has a first transmission spectrum having a first spectral slope; the second filter has a transmission spectrum having a second spectral slope; wherein the first filter transmits the third portion of the optical signal substantially at a first position on the first spectral slope and the second filter transmits the fourth portion of the optical signal at a second position of the second spectral slope, the first position and the second position being substantially at the particular wavelength.

9. The method of claim 8 wherein the third portion of the optical signal further includes a first polarization dependent loss and the fourth portion of the optical signal has a second polarization dependent loss, the second polarization dependent loss being significantly less than the first polarization dependent loss.

10. The method of claim 7 wherein the optical signal further includes a direction of propagation, wherein the first filter providing step (b) further includes the step of:
    (b1) orienting the first filter at a first angle from perpendicular to the direction of propagation, the first angle further comprising a rotation around the first axis of a first amount; and wherein the second filter providing step (c) further includes the step of:

the second filter being disposed at a second angle from perpendicular to the direction of propagation, the second angle further comprising a rotation around the second axis of a second particular amount, the second particular amount being substantially the same as the first particular amount.

11. The method of claim 10 wherein the comparing means providing step (d) further includes the steps of:

(d1) providing a first photodiode receiving the fourth portion of the optical signal; and (d2) a second photodiode receiving the second portion of the optical signal.

12. The method of claim 11 wherein the optical signal has first intensity, the fourth portion of the optical signal has a second intensity, the second portion of the optical signal has a third intensity, and wherein the comparing means providing step further includes the steps of:

(d3) providing means for detecting a drift in the fourth portion of the optical signal from the particular wavelength, the drift being detected by subtracting the third intensity from the second intensity to provide a subtracted intensity and dividing the subtracted intensity by the third intensity.

13. A method for stabilizing an input signal at a particular wavelength comprising the step of:

(a) separating an input signal into a first portion and a second portion;

(b) filtering the first portion of the input signal to provide a third portion of the input signal, the third portion having a first polarization dependence; and (c) filtering the third portion of the input signal to provide a fourth portion of the input signal, the filtering step further including compensating for the first polarization dependence, the fourth portion of the input signal having a second polarization dependence, the second polarization dependence being significantly less than the first polarization dependence.

14. The method claim 13 wherein the first filter has a first transmission spectrum having a first spectral slope; the second filter has a transmission spectrum having a second spectral slope; wherein the first filter transmits the third portion of the optical signal substantially at a first position on the first spectral slope and the second filter transmits the fourth portion of the optical signal at a second position of the second spectral slope, the first position and the second position being substantially at the particular wavelength.

15. The method of claim 14 wherein the input signal has a first intensity, the fourth portion of the input signal has a second intensity, and the second portion of the input signal has a third intensity, the method further comprising the steps of:

(d) measuring the second intensity; and (e) measuring the third intensity.

16. The method of claim 15 further comprising the step of:

(f) detecting a drift in the fourth portion of the optical signal from the particular wavelength, the drift being detected by subtracting the third intensity from the second intensity to provide a subtracted intensity and dividing the subtracted intensity by the third intensity.

17. The method of claim 16 wherein the optical signal further includes a direction of propagation, wherein the first filtering step (b) further includes the step of:

(b1) orienting a first filter at a first angle from perpendicular to the direction of propagation, the first angle further comprising a rotation around a first axis of a first amount; and wherein the second filtering step (c) further includes the step of:

(b2) orienting a second filter at a second angle from perpendicular to the direction of propagation, the second angle further comprising a rotation around a second axis of a second particular amount, the second particular amount being substantially the same as the first particular amount, the second axis being perpendicular to the first axis.

18. A wavelength locker comprising:

a beam splitter for receiving an optical signal and splitting the optical signal into a first portion of the optical signal and a second portion of the optical signal;

a first filter for receiving the first portion of the optical signal and transmitting a third portion of the optical signal, the first filter including a first axis, the first filter capable of being tuned by rotation around the first axis to transmit the third portion of the optical signal including a particular wavelength;

a second filter for receiving the third portion of the optical signal and transmitting a fourth portion of the optical signal, the second filter further including a second axis substantially perpendicular to the first axis, the second filter capable of being tuned by rotation around the second axis to transmit the fourth portion of the optical signal including the particular wavelength; and means for comparing the second portion of the optical signal to the fourth portion of the optical signal.

* * * * *